(12) United States Patent
Chou et al.

(10) Patent No.: US 9,577,083 B1
(45) Date of Patent: Feb. 21, 2017

(54) EMBEDDED HYDROGEN INHIBITORS FOR SEMICONDUCTOR FIELD EFFECT TRANSISTORS

(71) Applicant: NORTHROP GRUMMAN SYSTEMS CORPORATION, Falls Church, VA (US)

(72) Inventors: Yeong-Chang Chou, Irvine, CA (US); Richard Lai, Redondo Beach, CA (US); Quin W. Kan, Monterey Park, CA (US); Keang H. Kho, Garden Grove, CA (US); Hsu-Hwei Chen, Redondo Beach, CA (US); Matthew R. Parlee, Lawndale, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/072,261

(22) Filed: Mar. 16, 2016

(51) Int. Cl.
| | |
|---|---|
| *H01L 29/20* | (2006.01) |
| *H01L 23/66* | (2006.01) |
| *H01L 29/778* | (2006.01) |
| *H01L 29/205* | (2006.01) |
| *H01L 29/47* | (2006.01) |
| *H01L 29/423* | (2006.01) |
| *H01L 23/29* | (2006.01) |
| *H01L 23/31* | (2006.01) |

(52) U.S. Cl.
CPC ......... *H01L 29/7786* (2013.01); *H01L 23/291* (2013.01); *H01L 23/3171* (2013.01); *H01L 23/66* (2013.01); *H01L 29/205* (2013.01); *H01L 29/42316* (2013.01); *H01L 29/475* (2013.01); *H01L 2223/6683* (2013.01)

(58) Field of Classification Search
CPC ...... H01L 29/20; H01L 29/2003; H01L 29/77; H01L 29/7783; H01L 29/7787; H01L 29/66; H01L 29/66462; H01L 29/42; H01L 29/42316; H01L 29/423; H01L 29/47; H01L 29/475; H01L 29/778; H01L 29/7786; H01L 23/29; H01L 23/291; H01L 23/31; H01L 23/317; H01L 23/3171; H01L 23/66
USPC ......................................................... 257/194
See application file for complete search history.

(56) References Cited

U.S. PATENT DOCUMENTS

| | | | |
|---|---|---|---|
| 6,110,808 | A | 8/2000 | Saito |
| 6,548,889 | B2 | 4/2003 | Saito |
| 6,673,400 | B1 | 1/2004 | Bedinger et al. |
| 6,759,705 | B2 | 7/2004 | Yang et al. |

(Continued)

*Primary Examiner* — Monica D Harrison
(74) *Attorney, Agent, or Firm* — John A. Miller; Miller IP Group, PLC

(57) ABSTRACT

A field effect transistor (FET) device including a substrate and a plurality of semiconductor layers provided on the substrate, where a top semiconductor layer is a heavily doped cap layer and another one of the semiconductor layers directly below the cap layer is a Schottky barrier layer, and where a gate recess is formed through the cap layer and into the Schottky barrier layer. The FET device also includes a gate terminal having a titanium layer, an inhibitor layer provided on the titanium layer and a gold layer provided on the inhibitor layer, where the gate terminal is formed in the recess so that the titanium layer is in contact with the Schottky barrier layer, and where the inhibitor layer is effective for preventing hydrogen gas from being dissociated into hydrogen atoms so as to reduce or prevent hydrogen poisoning of the FET device.

20 Claims, 2 Drawing Sheets

(56) References Cited

U.S. PATENT DOCUMENTS

| | | | |
|---|---|---|---|
| 6,818,523 | B2 | 11/2004 | Miki et al. |
| 6,903,015 | B2 | 6/2005 | Matsui et al. |
| 6,984,857 | B2 | 1/2006 | Udayakumar et al. |
| 7,019,352 | B2 | 3/2006 | Udayakumar et al. |
| 7,256,437 | B2 | 8/2007 | Miki et al. |
| 7,622,080 | B2 | 11/2009 | Enquist |
| 7,777,318 | B2 | 8/2010 | Tornquist Hennig et al. |
| 8,481,999 | B2 | 7/2013 | Il Kim et al. |
| 8,669,644 | B2 | 3/2014 | Basim et al. |
| 8,829,634 | B2 | 9/2014 | Bonekamp et al. |
| 2010/0252864 | A1* | 10/2010 | Kawasaki ........... H01L 29/2003 257/194 |
| 2011/0088456 | A1* | 4/2011 | Ren ..................... G01N 33/005 73/31.06 |
| 2014/0335666 | A1* | 11/2014 | Koehler ............ H01L 29/66462 438/172 |

\* cited by examiner

US 9,577,083 B1

EMBEDDED HYDROGEN INHIBITORS FOR SEMICONDUCTOR FIELD EFFECT TRANSISTORS

BACKGROUND

Field

This invention relates generally to a field effect transistor (FET) device that includes a hydrogen inhibitor for preventing hydrogen poison induced degradation (HPID) of the device and, more particularly, to an FET device provided within a hermetically sealed package, where the FET device includes a hydrogen inhibitor that replaces platinum in a gate metal of the device, and where the hydrogen inhibitor prevents hydrogen gas from forming hydrogen atoms so as to eliminate HPID.

Discussion

It is known in the art to provide hermetically-sealed packages for integrated circuits, such as monolithic millimeter-wave integrated circuits (MMIC). One or more MMICs are fabricated on a semiconductor substrate, and mounted within a metal housing. A metal cover is then sealed to the housing in a vacuum environment to provide the hermetically-sealed package. These types of hermetically sealed MMICs have many applications, such as space-based applications, where device reliability is crucial.

MMICs that are contained with hermetically sealed packages usually include one or more FET devices, such as high electron mobility transistors (HEMT). A typical gate metal for the gate terminal of an FET device includes stacked layers of titanium (Ti), platinum (Pt) and gold (Au), where the gate terminal is covered with a silicon nitride passivation layer. In these types of packages, hydrogen gas $H_2$ is out-gassed from the hermetic package and is contained therein. It is believed that the hydrogen gas $H_2$ diffuses through the silicon nitride passivation layer and adsorbs on the surface of the platinum layer, which is catalyzed and dissociates into hydrogen atoms H. The hydrogen atoms H combine with the titanium in the gate metal to form $TiH_x$, which reduces the device gate voltage $V_g$ and decreases the device transconductance Gm, thus affecting device performance.

In order to alleviate hydrogen caused degradation of integrated circuit components within hermetically-sealed packages, sometimes referred to as hydrogen poison induced degradation (HPID), it has been proposed in the art to provide hydrogen getters within the package that absorb the hydrogen gas $H_2$ to remove it from the sealed package. Particularly, it is known in the art to deposit certain layers of material within the hermetically-sealed package that operate to absorb the hydrogen gas $H_2$ that may otherwise degrade device performance. For example, a hydrogen getter can be mounted to the cover of the hermetically sealed package discussed above. One known hydrogen getter includes a plurality of metal layers deposited on either the substrate wafer or the cover wafer, and may include titanium layers, nickel layers and palladium layers.

Although hydrogen getters have been effective for reducing or eliminating HPID in an FET device, fabricating the hydrogen getter in the sealed package increases the manufacturing cycle time of the integrated circuit including the FET device, which also increases cost. Further, hydrogen getters are not always reliable as they often degrade and/or malfunction before the end of the life of the FET device.

DETAILED DESCRIPTION OF THE EMBODIMENTS

The following discussion of the embodiments of the invention directed to providing a hydrogen inhibitor in the gate metal of an FET device is merely exemplary in nature, and is in no way intended to limit the invention or its applications or uses. For example, as mentioned, the hydrogen inhibitor will have specific application for an FET device. However, the hydrogen inhibitor of the invention may have other applications.

Figure 1:
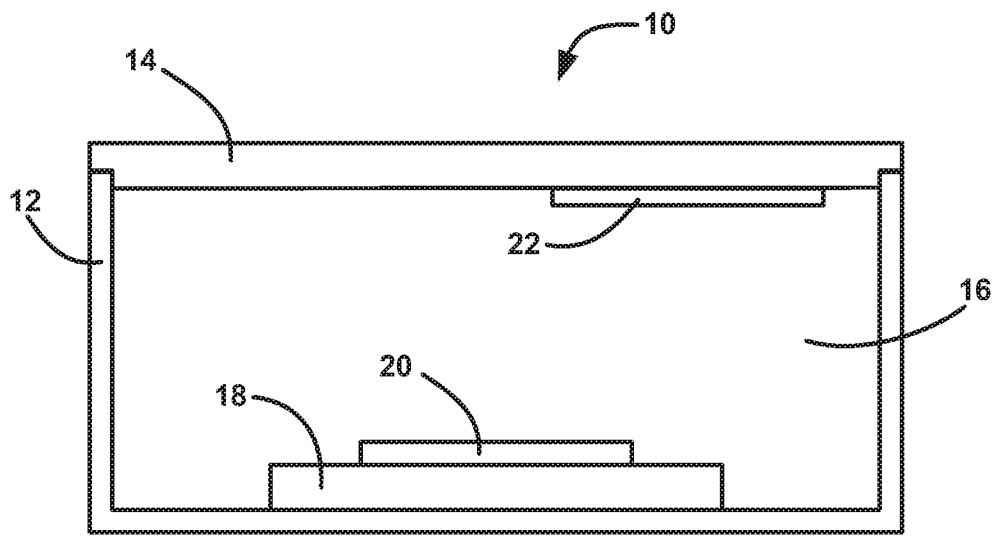
FIG. 1 is a cross-sectional type view of a hermetically-sealed package including an MMIC and a hydrogen getter.

FIG. 1 is a cross-sectional type view of a hermetically-sealed package 10 including a metal housing 12 and a metal cover 14 defining a hermetically sealed cavity 16 therein. An MMIC 20 is fabricated on a semiconductor substrate 18 and the substrate 18 is mounted to the housing 12 within the cavity 16 before the cover wafer 14 is sealed to the housing 12. Also, a hydrogen getter 22 is fabricated on a substrate and the substrate is mounted to an under-side of the cover 14 prior to the cover 14 being sealed to the housing 12, where the hydrogen getter 22 acts to absorb hydrogen gas $H_2$ within the cavity 16. The hydrogen getter 22 can be deposited on other surfaces within the package 10 in other designs.

Figure 2:
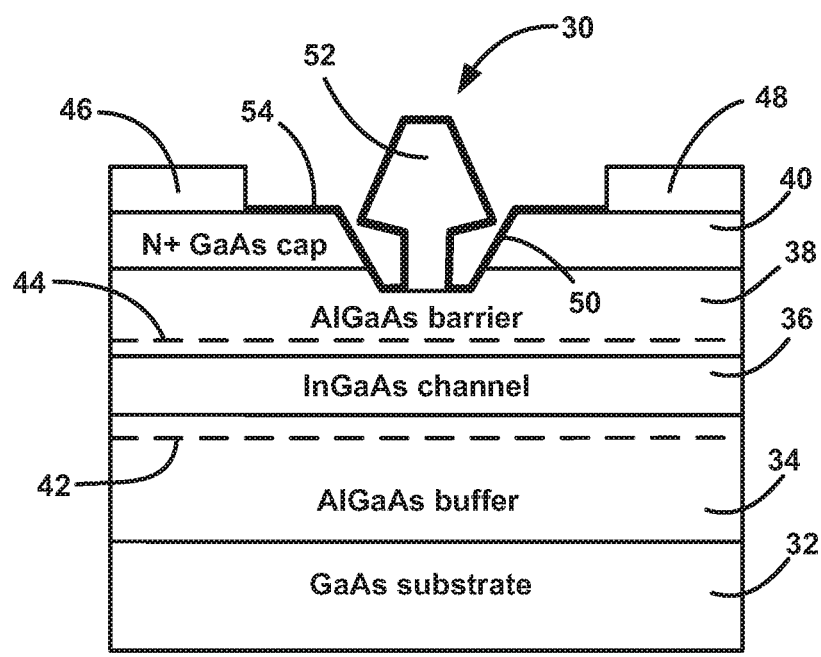
FIG. 2 is a profile view of an FET device.

FIG. 2 is a profile view of an FET device 30, such as a high electron mobility transistor (HEMT), that can be part of the MMIC 20 and/or an integrated microwave assembly. The FET device 30 includes a GaAs substrate 32, an AlGaAs buffer layer 34 deposited on the substrate 32, an InGaAs channel layer 36 deposited on the buffer layer 34, an AlGaAs Schottky barrier layer 38 deposited on the channel layer 36, and a heavily doped N+ GaAs cap layer 40 deposited on the barrier layer 38. The buffer layer 34 and the barrier layer 38 are doped proximate to the channel layer 36 to define silicon planar doping layers 42 and 44, respectively. Ohmic contacts including a source terminal 46 and a drain terminal 48 are deposited on the cap layer 40. A gate recess 50 is fabricated through the cap layer 40 and into the barrier layer 38, and a T-shaped gate terminal 52 is formed in the recess 50. A silicon nitride (SiN) passivation layer 54 is deposited over the gate terminal 52, on the cap layer 40 between the source and drain terminals 46 and 48, and in the recess 50, as shown.

Figure 3:
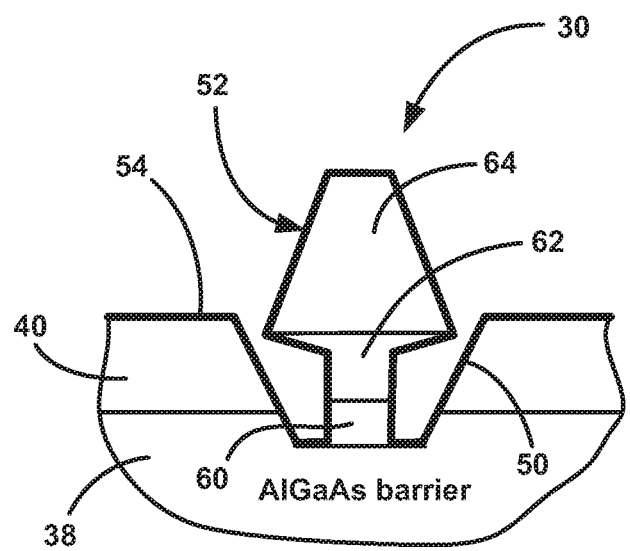
FIG. 3 is a broken-away profile view of the FET device shown in FIG. 2 including a gate terminal.

FIG. 3 is a broken-away profile view of the FET device 30 showing the gate terminal 52. As discussed above, the gate terminal 52 may include a titanium (Ti) layer 60 deposited on the barrier layer 38, a platinum (Pt) layer 62 deposited on the titanium layer 60 and a gold (Au) layer 64 deposited on the platinum layer 62. The titanium layer 60 is selected to form a desirable Schottky junction with the barrier layer 38, and the gold layer 64 provides a low contact resistance in a manner well understood to those skilled in the art. Because the gold layer 64 has a relatively low melting point, the platinum layer 62 acts as a diffusion barrier to prevent gold from diffusing into the titanium layer 60 during operation of the device 30.

As discussed, hydrogen gas $H_2$ is released into the hermetically sealed package, for example, the package 10, diffuses through the passivation layer 54 and adsorbs onto the surface of the platinum layer 62, where it is catalyzed and dissociates into hydrogen atoms H. The hydrogen atoms H combine with the titanium in the layer 60 to form $TiH_x$ that affects the Schottky junction with the barrier layer 38, which reduces the device gate voltage $V_g$ and decreases the device transconductance Gm, thus affecting device performance, referred to as hydrogen poison induced degradation of the device 30. The present invention proposes replacing the platinum metal in the gate terminal 52 with a hydrogen inhibitor layer that prevents the hydrogen gas $H_2$ from dissociating into the hydrogen atoms H, which would thus eliminate the formation of $TiH_x$, and thus the hydrogen poison induced degradation of the device 30.

Figure 4:
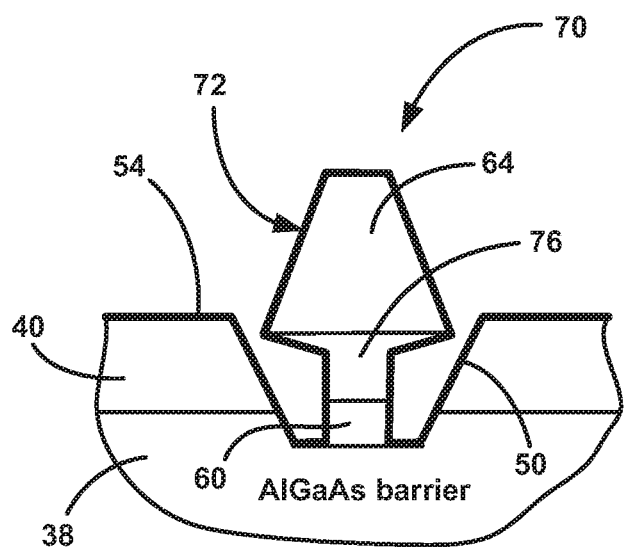
FIG. 4 is a broken-away profile view of an FET device including a gate terminal having a hydrogen inhibitor layer, where the gate terminal can be used in the FET device shown in FIG. 2.

FIG. 4 is a broken-away profile view of an FET device 70 including a gate terminal 72 that could replace the gate terminal 52 in the device 30, where the same elements to those of FIGS. 2 and 3 are identified with the same reference number. In the gate terminal 72, the platinum layer 62 in the device 30 that caused the dissociation of hydrogen gas $H_2$ into hydrogen atoms H is replaced with an inhibitor layer 76 that does not allow the dissociation of hydrogen gas $H_2$ into hydrogen atoms H. Because no hydrogen atoms H are formed even though hydrogen gas $H_2$ is still present in the package and diffuses through the passivation layer 54, there are no hydrogen atoms H to react with the titanium metal to form $TiH_x$. Because there is no formation of $TiH_x$, there is no hydrogen poisoning to affect the device performance. The material of the inhibitor layer 76 is selected to not only prevent the dissociation of hydrogen gas $H_2$ into hydrogen atoms H, but also be suitable to provide a diffusion layer to prevent gold from the gold layer 64 from diffusing into the titanium layer 60 in the same manner as the platinum layer 62.

It is noted that the titanium layer 60 and the gold layer 64 are still maintained in the gate metal, and as such the performance of the FET device 70 is virtually unaffected even though a different gate metal is employed. Using the hydrogen inhibitor layer 76 does not add an additional layer to the fabrication of the FET device 70, but reduces the fabrication cost of the FET device 70 as a result of not needing a hydrogen getter. Further, the inhibitor layer 76 provides higher reliability than employing the traditional hydrogen getters because the known hydrogen getters may malfunction before the end of the life of the FET device.

The present invention contemplates any suitable refractory metal for the inhibitor layer 76 that prevents the dissociation of hydrogen gas $H_2$ into hydrogen atoms H, prevents gold from diffusing into the titanium layer 60, and does not reduce device performance. In one embodiment, the inhibitor layer 76 is titanium-tungsten (TiW) and is deposited to a thickness of 30-50 Å, which is less than the thickness of the platinum layer 62. It is noted, however, that other thicknesses may also be applicable. The thinner inhibitor layer 76 is necessary because of the high temperature deposition process of the layer 76. Titanium-tungsten has been shown to be effective for preventing hydrogen poisoning in the manner discussed above for the lifetime of an FET device for many applications, including space-based applications.

Although titanium-tungsten is one suitable refractory metal for the inhibitor layer 76 as discussed above, other refractory metals may also be equally applicable. For example, other suitable refractory metals may include molybdenum (Mo), rhodium (Rh), tantalum (Ta), iridium (Ir) and tungsten (W), all provided in suitable thicknesses.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A field effect transistor (FET) device comprising:
   a substrate;
   a plurality of semiconductor layers provided on the substrate; and
   a gate terminal provided on the plurality of semiconductor layers, said gate terminal including a first gate metal layer provided in contact with one of the semiconductor layers, an inhibitor layer provided on the first gate metal layer and a second gate metal layer provided on the inhibitor layer, said inhibitor layer being effective for preventing hydrogen gas from being dissociated into hydrogen atoms so as to reduce or prevent hydrogen poisoning of the FET device.

2. The FET device according to claim 1 wherein the inhibitor layer is a titanium-tungsten layer.

3. The FET device according to claim 2 wherein the inhibitor layer has a thickness in the 30-50 Å range.

4. The FET device according to claim 1 wherein the inhibitor layer is selected from the group consisting of molybdenum, rhodium, tantalum, iridium and tungsten.

5. The FET device according to claim 1 wherein the first gate metal layer is titanium and the second gate metal layer is gold.

6. The FET device according to claim 1 wherein a top semiconductor layer of the plurality of semiconductor layers is a heavily doped cap layer and another one of the semiconductor layers directly below the cap layer is a Schottky barrier layer, and wherein the FET device includes a gate recess formed through the cap layer and into the Schottky barrier layer, and wherein the gate terminal is formed in the recess so that the first gate metal layer is in contact with the Schottky barrier layer.

7. The FET device according to claim 6 wherein the cap layer is an N+ GaAs layer and the barrier layer is an AlGaAs barrier layer.

8. The FET device according to claim 1 further comprising a silicon nitride passivation layer formed over the gate terminal.

9. The FET device according to claim 1 wherein the FET device is a high electron mobility transistor.

10. The FET device according to claim 1 wherein the FET device is sealed in a hermetically-sealed package.

11. The FET device according to claim 1 wherein the FET device is part of an integrated microwave assembly.

12. A field effect transistor (FET) device comprising:
    a substrate;
    a plurality of semiconductor layers provided on the substrate, wherein a top semiconductor layer of the plurality of semiconductor layers is a heavily doped cap layer and another one of the semiconductor layers directly below the cap layer is a Schottky barrier layer, and wherein a gate recess is formed through the cap layer and into the Schottky barrier layer; and
    a gate terminal including a titanium layer, an inhibitor layer provided on the titanium layer and a gold layer provided on the inhibitor layer, wherein the gate terminal is formed in the recess so that the titanium layer is in contact with the Schottky barrier layer, said inhibitor layer being effective for preventing hydrogen gas from being dissociated into hydrogen atoms so as to reduce or prevent hydrogen poisoning of the FET device.

13. The FET device according to claim 12 wherein the inhibitor layer is a titanium-tungsten layer.

14. The FET device according to claim 13 wherein the inhibitor layer has a thickness in the 30-50 Å range.

15. The FET device according to claim 12 wherein the inhibitor layer is selected from the group consisting of molybdenum, rhodium, tantalum, iridium and tungsten.

16. The FET device according to claim 12 wherein the cap layer is an N+ GaAs layer and the barrier layer is an AlGaAs barrier layer.

17. The FET device according to claim 12 wherein the FET device is a high electron mobility transistor.

18. The FET device according to claim 12 wherein the FET device is sealed in a hermetically-sealed package.

19. A field effect transistor (FET) device comprising:
a substrate;
a plurality of semiconductor layers provided on the substrate, wherein a top semiconductor layer of the plurality of semiconductor layers is a N+ GaAs cap layer and another one of the semiconductor layers directly below the cap layer is an AlGaAs Schottky barrier layer, and wherein a gate recess is formed through the cap layer and into the Schottky barrier layer; and
a gate terminal including a titanium layer, a titanium-tungsten inhibitor layer provided on the titanium layer and a gold layer provided on the inhibitor layer, wherein the gate terminal is formed in the recess so that the titanium layer is in contact with the Schottky barrier layer, said inhibitor layer being effective for preventing hydrogen gas from being dissociated into hydrogen atoms so as to reduce or prevent hydrogen poisoning of the FET device.

20. The FET device according to claim 19 wherein the inhibitor layer has a thickness in the 30-50 Å range.

* * * * *